United States Patent [19]

Nishimura et al.

[11] Patent Number: 4,740,694

[45] Date of Patent: Apr. 26, 1988

[54] METHOD AND APPARATUS FOR ANALYZING POSITRON EXTINCTION AND ELECTRON MICROSCOPE HAVING SAID APPARATUS

[75] Inventors: Eiichi Nishimura, Hitachi; Kazumichi Suzuki, Mito, both of Japan

[73] Assignee: Hitachi, Ltd., Tokyo, Japan

[21] Appl. No.: 910,143

[22] Filed: Jun. 4, 1986

[30] Foreign Application Priority Data

Jun. 7, 1985 [JP] Japan ............................. 60-122475
Jul. 11, 1985 [JP] Japan ............................. 60-151356

[51] Int. Cl.$^4$ ............................................. G01N 23/00
[52] U.S. Cl. ..................................... 250/306; 250/307; 250/399
[58] Field of Search ............... 250/306, 307, 308, 311, 250/310, 399

[56] References Cited

U.S. PATENT DOCUMENTS

| | | | |
|---|---|---|---|
| 2,582,981 | 1/1952 | Fua | 250/307 |
| 4,064,438 | 12/1977 | Alex et al. | 250/308 |
| 4,463,263 | 7/1984 | Padawer | 250/308 |

OTHER PUBLICATIONS

"Point Defects and Radiation Effects in B.C.C. Metals", Frank; *Proceedings of the Yamada Conference V in Kyota, Japan*, Nov. 16-20, 1981, pp. 203-208.

*Primary Examiner*—Bruce C. Anderson
*Attorney, Agent, or Firm*—Antonelli, Terry & Wands

[57] ABSTRACT

This invention relates to a method and apparatus for positron extinction analysis which irradiates a positron beam to a sample to be analyzed through a convergent lens system consisting of a magnetic lens and measures the extinction γ-rays generated from the sample for the positron extinction analysis. The invention utilizes the property of the magnetic lens of an electron microscope that the magnetic lens has the same focal distance for both the positron and the electron having mutually the same energy. If the magnetic lens of the electron microscope is used as a convergent lens system for a positron beam, the positron beam can be radiated highly accurately to a very small, local position of the sample which is being observed through the electron microscope. For instance, in the case of a transmission type electron microscope, the convergent lens system of the electron beam is used as a convergent lens system of the positron beam.

33 Claims, 15 Drawing Sheets

FIG. 1
FIG. 2
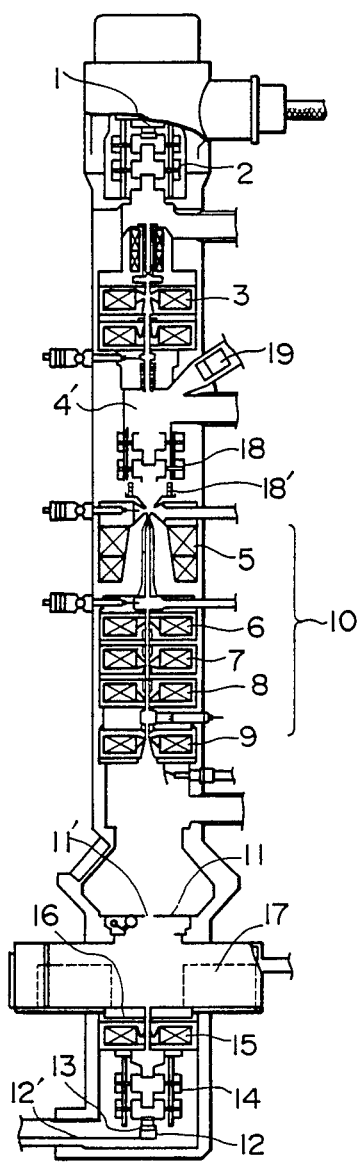
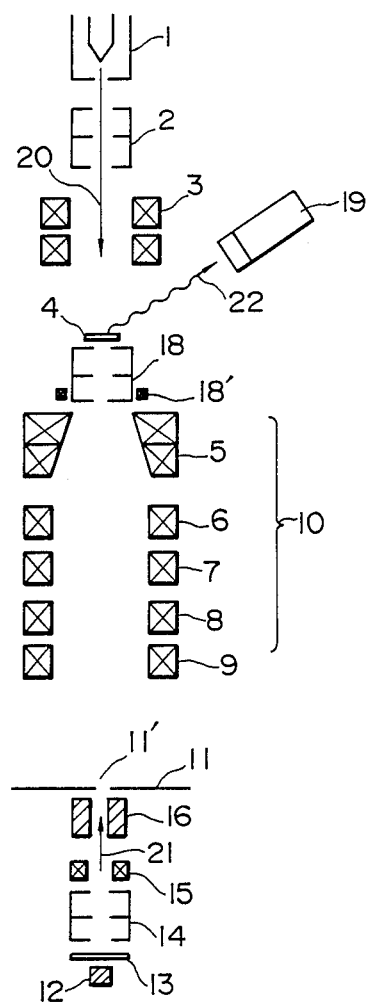

FIG. 21
FIG. 22
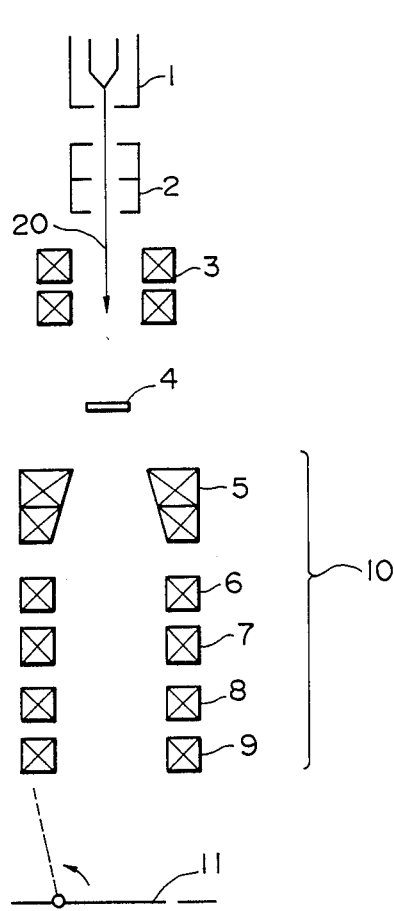
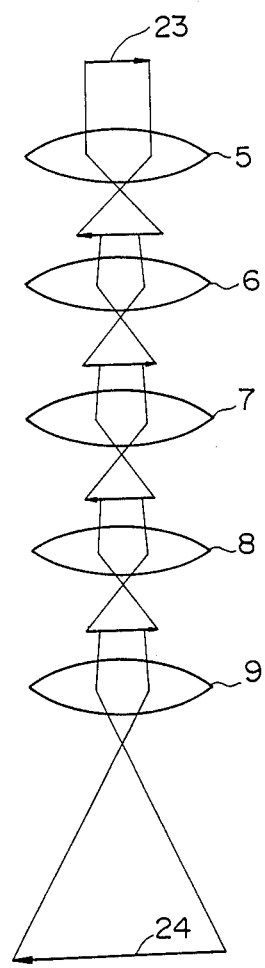

METHOD AND APPARATUS FOR ANALYZING POSITRON EXTINCTION AND ELECTRON MICROSCOPE HAVING SAID APPARATUS

BACKGROUND OF THE INVENTION

This invention relates to a method and apparatus for analyzing positron extinction or annihilation which analyzes a sample by utilizing a positron extinction analytical method and to an electron microscope equipped with such an apparatus, and more particularly to technique which irradiates highly accurately positrons to an analytical position of a sample.

A positron extinction method is an analytical method which implants positrons into a sample, causes pair extinction or annihilation of the positrons with electrons in the sample and senses the γ-rays emitted thereby in order to obtain various data such as an electron structure and lattice defect in the sample, and the like. The positron is a particle which has the same rest mass as that of the electron, whose absolute value is equal to that of the charge of the electron (negative charge) but whose polarity is opposite to that of the electron. A positron source uses a radioisotope (e.g. $^{22}$Na) which is sealed in the source and causes $+\beta$ decay. When the positron having energy of several hundreds of keV emitted from this positron source is radiated to a sample, the positron jumping into the sample impinges repeatedly against ion and electron, whereby the positron is converted to thermal energy of about ~0.025 eV within a short period of about $10^{-12}$ seconds. When the sample is a metal, the positron thus converted to thermal energy causes pair extinction together with electron with life of from 100 to 300 PS.

At this time, two γ-rays of about keV (that is, the energy corresponding to the rest mass of the positron and electron) are emitted in substantially the opposite directions. The angles and energy of the two γ-rays depend upon the momentum that the positron-electron pair has at the time of the pair extinction (it is possible in this case to neglect substantially the momentum of the positron and to take into consideration only the momentum of the electron) from the law of conservation of the total energy and the total momentum including the mass at the time of pair extinction, and the two γ-rays are distributed within an angular range (within ±25 m rad) with direction of 180° being the center. Therefore, the energy, too, exhibits a Doppler width with 511 keV being the center. Accordingly, the momentum distribution of the electron in the sample can be determined by either measuring accurately the angular distribution of the two γ-rays (measurement of $\gamma-\gamma$ angular correlation) or measuring the energy distribution of the γ-rays (Doppler width).

Hereinafter, a conventional positron extinction analytical method (refer to "Lattice Defect", Lectures On Experimental Physics (published by Kyoritsu Publication Co.), p. 163–175 (1978)) with reference to FIGS. 19 and 20 of the accompanying drawings.

FIG. 19 shows a conventional apparatus for measuring the energy spectrum of extinction γ-rays (which are generated by the pair extinction of the positron and the electron). The positron 21 emitted from a positron source 12 (e.g. $^{22}$Na) is radiated to a sample 34, the extinction γ rays 22 are detected by a γ-ray detector 19 and the energy spectrum of the extinction γ-rays is measured. The energy of two photons (γ-rays) emitted at the time of extinction is both about 511 keV. The kinetic energy of the electron as the counter-part of the pair extinction is only a few eV, and for this reason, the energy of the extinction γ-rays deviates from 511 keV. In a laboratory system, the energy width $\delta_E$ of the energy spectrum of the extinction γ-rays is $CP_l/2$ due to the Doppler effect. Here, C is a light velocity and $P_l$ is a momentum component in the emitting direction. Accordingly, the energy width $\delta_E$ expands to about 2 keV and can be measured by use of a Ge(Li) solid state detector (SSD) having high resolution, for example, as the γ-ray detector 19.

FIG. 20 shows schematically the energy spectrum of the extinction γ-rays. An S parameter is used for measuring the energy spectrum of the extinction γ-rays. This S parameter is expressed by the following equation using the area A at the center of the spectrum and the areas $B_1$ and $B_2$ at both end portions in FIG. 20:

$$S = A/(B_1 + B_2) \tag{1}$$

The center portion A of the spectrum is a region to which the γ-rays resulting from the pair extinction of the positron and the free electron-like electron contribute primarily, while both end portions $B_1$ and $B_2$ are those regions to which the γ-rays resulting from the pair extinction of the positron and the inner shell electron contribute primarily. The measurement of the S parameter is extremely effective means for studying the lattice defect, particularly the lattice defect having a low ion concentration such as a tensile stress portion of lattice vacancy, edge dislocation.

Let's consider the atomic void in a metal by way of example.

(1) Since the atomic void is formed by pulling out a cation, it is charged negative in comparison with a complete crystal. Since the position is charged positive, it is attracted to the atomic void due to the Coulomb mutual action when it comes near to the atomic void. When the atomic void concentration is about $10^{-14}$, almost all the positrons are attracted to the atomic voids and disappear near the atomic voids.

(2) The potential energy of the electron alone due to the fall-off of the cation at the atomic void is almost flat and the electron becomes like a free electron. Therefore, the greater the number of positrons that disappear at the atomic voids, the greater becomes the pair extinction with the free electron-like electrons and the greater becomes the S parameter. (The center portion A of the spectrum becomes relatively greater than both end portions $B_1$ and $B_2$).

(3) When a plurality of atomic voids gather and form a void cluster, the electron becomes further like free electron and the S parameter becomes further greater.

As described above, the S parameter is effective for examining the generation of the atomic voids and the recovery process. For instance, when electrons of 3 MeV are radiated at 10K to copper (Cu), the S parameter increases with the radiation. This is because the copper atom is sprung out from the lattice point by the high speed electron, thereby forming the atomic void. When the damage caused by radiation is recovered by raising the temperature after the radiation, the S parameter increases at a stage III (a temperature range in which the atomic void can move). (Refer to S. Mantle et al: "Phys. Rev. Left", 34, p. 1554 (1975).) This is because the atomic voids move at the stage III and the void cluster is formed thereby.

Besides the extinction or annihilation γ-ray energy spectrum measurement described above, the positron extinction or annihilation method includes γ—γ angular correlation measurement and positron life measurement. (For example, when the positron is trapped into the empty lattice point from which the lattice atom of a metal crystal lattice falls off, it is known that the life extends. Therefore, the empty lattice point concentration in the metal can be determined by measuring the life of the positron.) They are also extremely effective means for studying the lattice deffect in the same way as the method described above. However, since all of these conventional positron extinction methods simply irradiate the positrons emitted from the positron source to the sample, the resulting data are unavoidably averaged data for a wide range because the positron radiation surface of the sample is generally from several mm$^2$ to several cm$^2$.

SUMMARY OF THE INVENTION

The present invention is directed to obtain a positron extinction or annihilation analytical method and apparatus which can implant highly accurately positrons into a very small local position of a sample to be analyzed.

The present invention irradiates a positron beam to a sample through a convergent lens system consisting of magnetic lenses in order to implant highly accurately the beam into a very small local position of the sample to be analyzed.

If a magnetic lens system of an electron microscope is used as the magnetic lens described above, the positron beam can be implanted highly accurately into a very small local position of the sample which is being observed through the electron microscope.

Since the magnetic lens of the electron microscope has the same focal distance for the positron and the electron that have the same energy with each other, the positron beam can be implanted accurately into the position of the sample which is observed through the electron microscope by implanting the positrons into the sample set to the microscope by utilizing an image-forming lens.

When the magnetic lens of the electron microscope is used, the positron beam can be irradiated highly accurately into the very small local position of the sample which is being observed through the microscope, by using the image-forming lens system for the electron beam as the convergent lens system for the positron beam if an electron microscope having an image-forming system such as a transmission type electron microscope is used.

In the case of scanning electron microscopes, the convergent lens system for the electron beam is used as the convergent lens system for the positron and the positron beam is converted to the electron probe type in the same way as the electron beam so that the positron beam can be irradiated highly accurately to a very small local position of the sample which is being observed through the electron beam.

BRIEF DESCRIPTION OF THE DRAWINGS

FIG. 1 is a longitudinal sectional view of an apparatus in accordance with a first embodiment of the present invention;

FIG. 2 is a schematic structural view of the apparatus shown in FIG. 1;

FIG. 21 is a schematic structural view of a general transmission type electron microscope;

FIG. 22 is a view useful for explaining the principle of the transmission type electron microscope shown in FIG. 21.

DESCRIPTION OF THE PREFERRED EMBODIMENTS

Figure 3:
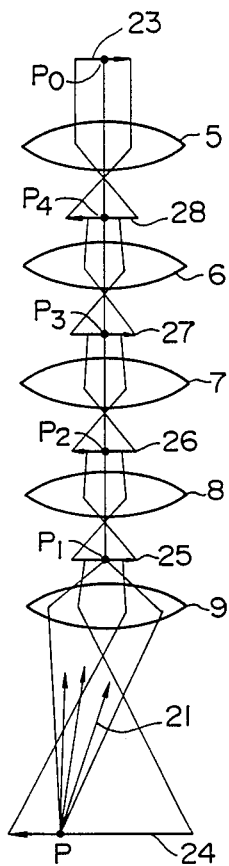
FIGS. 3 to 8 are views useful for explaining the principle of the present invention.

Hereinafter, the present invention will be described with reference to an exemplary case where positrons are irradiated to a sample by utilizing a magnetic lens of an electron microscope.

Recently, attempts have been made to examine in situ a defect generation process by directly irradiating ions to a sample under a transmission type electron microscope in order to examine the kinetics of the radiation damage generation process in studies on radiation damage. However, though the electron microscope (hereinafter referred to as "microscope") can observe voids formed by the aggregation of single lattice defect (dot defect) such as atomic voids and secondary defect such as dislocation loop, it can not observe the dot deffect itself.

In order to clarify in detail the kinetics of the generation process of radiation damage described above, it would be extremely effective if the information such as dot defect concentration in the vicinity of these secondary defects could be obtained by use of the positron extinction method described already. A drastic progress can also be expected in the studies of properties if information on the local electron structure at the observation position of the microscope, and the like can be obtained. In order to accomplish these objects, however, the positions must be accurately implanted into the sample at such a position that corresponds to a desired image in the observation field of the microscope, but there has not been available any technique that can accurately implant the positrons into a very small local position in the sample.

Next, the construction and principle of a transmission type electron microscope will be described briefly.

FIG. 21 is a structural view showing the construction of the transmission electron microscope. The microscope consists of a irradiation system for an electron beam to a sample, and an image forming system for expanding the electron beam that has passed through the sample and for forming the image on a fluorescent plate (image forming surface). The radiation system in turn consists of an electron gun 1, an acceleration tube 2, a condensor lens 3, and the like. The image forming system consists of an objective lens 5, intermediate lenses 6, 7 and projecting lenses 8, 9. The intermediate lenses include a first intermediate lens and a second intermediate lens. The condensor lens 3 of the irradiation system has the function of converging the electron beam into parallel beams, and the objective lens 5 has the function of determing the focal distance. The intermediate lenses 6, 7 and the projecting lenses 8, 9 have the function of determining the magnification.

The electron beam 20 emitted from the electron gun 1 is accelerated by the acceleration tube 2 to such energy that is sufficient to pass through the sample 4 (generally, the sample is from 0 to 5,000 Å-thick and the electron beam energy is from about 50 to about 200 keV). After being accelerated to desired energy, the electron beam 20 is converged into parallel beams by the condensor lens 3 and irradiated to the sample 4. At this time, the beam diameter is several microns ($\mu$m). While passing through the sample 4, the electron beam is subjected to scattering and diffraction in accordance with the texture inside the sample. Therefore, the section of the electron beam after passing through the sample exhibits the data on the texture of the sample in terms of beam density. (Scattering lines and diffraction lines are cut by a slit.) This electron beam 20 is expanded by use of the objective lens 5, the intermediate lenses 5, 6 and the projecting lenses 8, 9, and the image is formed on the fluorescent plate 11. Since the fluorescent intensity changes in accordance with the beam density on the fluorescent plate 11 (that is, in accordance with the data on the texture), the magnified image of the texture of the sample can be visually observed.

FIG. 22 illustrates the mode of expansion of the electron beam after passing through the sample. Each lens of the image forming system is arranged in such a manner as to further expand a part of the image formed by a preceding lens, and a final image can be obtained as represented by reference numeral 24.

The above explains the fundamental construction and principle of the transmission electron microscope. Recently, various electron microscopes having scanning electron microscope function, characteristics X-ray analysis function, and the like, have been proposed and put into practical application, besides the scanning electron microscope described above. However, there have not yet been available any electron microscopes of the kind described above to which the analytical function by use of the positron extinction method is added.

Next, a definite embodiment of the present invention will be described with reference to this transmission electron microscope by way of example.

FIG. 1 shows an embodiment of the apparatus of the present invention, which consists fundamentally of a transmission electron microscope to which the positron extinction analytical function is added. In other words, this apparatus includes a positron irradiation apparatus and an extinction $\gamma$-ray measuring apparatus in addition to a conventional transmission electron microscope.

The position irradiation apparatus consists of a positron source 12, a thermalizing plate 13 fitted to the surface of the positron source 12, a positron acceleration tube 14 (including an extraction electrode), a convergent lens 15 and a collimator 16. A $^{22}$Na source (positron energy range: 0~540 keV) is used as the positron source 12, while an aluminum foil is used as the thermalizing plate 13. The extinction $\gamma$-ray measuring apparatus 19 is disposed slantingly at the rear of the sample as viewed from the direction of the positron radiation apparatus, and consists of one extinction $\gamma$-ray detector (Ge(Li) detector).

The transmission electron microscope consists of the electron gun 1, the acceleration tube 2, the condensor lens 3, a sample setting portion 4', the image forming system 10 and the image forming surface 11. Reference numeral 17 represents a film chamber disposed at the rear of the image forming surface 11, and the positron irradiation apparatus is disposed on the opposite side to the film chamber 17. Reference numeral 18 represents a positron deceleration tube disposed between the image forming lens system 10 and the sample setting portion 4'. The deceleration tube 18 decelerates the positron emitted from the positron irradiation apparatus before the positron is implanted into the sample set to the sample setting portion 4', lest the positron passes through the sample. Reference numeral 18' represents a correction coil.

A predetermined voltage $V_0$ in the range of from 0 to 200 kV is applied to the acceleration tube 2 of the transmission electron microscope. A voltage $V_0/2$ is applied to the positron acceleration tube 14 and to the positron deceleration tube 18. However, the polarity of the voltage applied to the positron deceleration tube 18 is opposite to that of the voltages applied to the acceleration tube 2 and to the positron acceleration tube 14. Incidentally, an aperture 11' is disposed at the center of the fluorescent plate 11 (image forming surface) so that the positron beam emitted from the positron irradiation apparatus can pass through it.

The positron irradiation apparatus is disposed for irradiating the positrons emitted from the positron source to the sample, and the extinction $\gamma$-ray measuring apparatus 19 is disposed to detect and count the extinction $\gamma$-rays that are generated when the positrons undergo extinction inside the sample. The image forming lens system 10 magnifies the electron beam passing through the sample and forms the image. It consists of the objective lens 5, the first intermediate lens 6, the second intermediate lens 7, the first projecting lens 8 and the second projecting lens 9. Incidentally, implantation of the positron beam (or the electron beam) into the sample from the side of the image forming surface (fluorescent plate) 11 through the image forming lens system 10 is called "inverse image formation" and the image formed on the sample thereby is called "inverse image".

Next, the operation sequence of the apparatus of the present invention will be described. FIG. 2 is a schematic structural view of the apparatus shown in FIG. 1 and the description will be made with reference to this drawing.

First of all, a voltage $V_0$ (kV) is applied to the acceleration tube 2 while $-(V_0/2)(kV)$ is applied to the positron deceleration tube 18. The electron beam 20 emitted from the electron gun 1 and having energy $V_0$ (kV) passes through the sample 4 and is then decelerated by the positron deceleration tube 18 to an electron beam having energy $V_0/2$ (keV). Though the positron deceleration tube 18 is disposed to decelerate the positron beam, the electron beam, too, is decelerated in the same way as the positron beam because it passes through the positron deceleration tube 18 in the direction opposite to the positron beam.

The electron beam thus converted to the energy $V_0/2$ (keV) is subjected to the image formation on the fluorescent plate 11 through the image forming lens system 10 on the basis of the principle described above and the sample texture is observed through the electron microscope. If there is any positron which is desired to be analyzed by the position extinction method in the image that is being observed, the position of the sample 4 is finely adjusted so that the position to be analyzed comes to the center of the fluorescent plate, that is, to the position of the aperture 11'. Next, the positron source 12 is mounted to the position irradiation apparatus, and the voltage $V_0/2$ (keV) is applied to the positron acceleration tube 14. In this manner, the positron emitted from thr positron source 12 (in the energy range of 0 to 540 keV) is made to be incident into the thermalizing plate 13 and then thermalized. After the energy distribution width is set in the order of 1 eV, the positron is accelerated by the positron acceleration tube 14, thereby generating a monochroic positron beam 21 having the energy of $V_0/2$ (keV). (As to the method of generating the positron beam having the monochroic energy by the combination of the heat-converting plate 13 and the acceleration tube 14, refer to "Front Line of Physics", pulbished by Kyoritsu Publication Co., p. 58, (1983)).

This positron beam 21 is focused on the aperture 11' at the center of the fluoroescent plate (image forming surface) 21 by use of the convergent coil 15. In other words, the beam is contracted maximum when the beam 21 passes through the aperture 11'. The positron beam 21 thus passing through the aperture 11' is subjected to the inverse image formation on the sample 4 by the image forming lens system 10 on the basis of a later-appearing principle. That is to say, the positron beam 21 is implanted into the position of the sample corresponding to the image formed in the region of the aperture 11' at the center of the fluorescent plate 11.

Here, it is of importance that the energy of the positron beam 21 when it passes through the image forming lens 10 be $V_0/2$ (keV) and be equal to the energy $V_0/2$ (keV) of the electron beam passing through the image forming lens system 10 in the opposite direction. Here, the positron deceleration tube 18 has the following two functions.

(1) In order to cause the inverse image formation of the positron beam, the energy of the positron beam passing through the image forming lens system 10 must be the same as the energy of the electron beam. Therefore, the positron deceleration tube 18 has the function of decelerating the energy of the electron beam 20 from $V_0$ (keV) to the energy value $V_0/2$ (keV) of the positron beam 21. Since the electron beam energy when it passes through the sample is $V_0$ (keV), the sample transmission force of the electron beam for the electron microscope is not lost.

(2) When the inverse image formation of the positron beam 21 is made on the sample 4 through the image forming lens system 10, most of the positron beam 21 pass through the sample 4 in the same way as the electron beam 20 if the energy of the positron beam 21 remains at $V_0/2$ (keV). Therefore, the positron deceleration tube 18 has the function of decelerating the energy of the positron beam 21 from $V_0/2$ (keV) to about the thermal energy (~0 keV), and the positron beam is then implanted into the sample. If the electron beam 20 passing through the sample 4 is a parallel beam, the positron beam that has formed the inverse image is also a parallel beam. If the electron beam 20 is not a complete parallel beam, however, the positron beam 21 that has formed the inverse image is not a parallel beam, either. Since the velocity remains in a vertical direction to an electric field when the positron is decelerated by the positron deceleration tube 18, a error occurs in the implantation position. Therefore, the correction coil 18' is disposed in order to correct the orbit of the electron beam 21 at the time of the inverse image formation.

The energy distribution of the extinction γ-rays resulting from the positron thus implanted into the sample 4 is measured by the extinction γ-ray detection apparatus 19, and predetermined positron extinction analysis is carried out.

For example, when the $^{22}$Na source of 1Ci is used as the positron source 12, about 1,000 positrons per second can be implanted into the sample 4 by assuming that the probability that the resulting positrons pass through the thermalizing plate 13 and are introduced into the positron acceleration tube 14 is $10^{-4}$, and the probability that the converged positron beam 21 is lost before it is implanted into the sample is $\frac{1}{2}$. At this time, if the measurement of the 100 channel extinction γ-ray energy distribution is conducted for 100 seconds, it is possible to obtain data wherein the statistical error for each channel is up to 5%.

As in the embodiment described above, the positron irradiation apparatus whose axial center (which is defined to be the same as the axial center of the positron acceleration tube 14) is in agreement with the axial center of the image forming lens system will be hereinafter called a "linear type axial center irradiation apparatus".

Next, the principle of the present invention about an apparatus having an image forming lens system such as TEM with reference to FIGS. 3 through 6.

FIG. 3 illustrates the principle of the inverse image formation. It will be assumed that a final magnified image 24 is obtained from an object (sample) 23 by the image forming lens system 10. It will be assumed also that the image of the position $P_0$ of the object 23 is sequentially formed by each lens, and an image is formed at a point $P_1$ for the image 25 and an image is finally formed at a point P. Now, let's consider the lens 9. The ray (or the electron beam in this case) leaving the point $P_1$ is converged to the point P by the lens 9. On the contrary, the ray (or the electron beam in this case) leaving the point P is imaged at the point $P_1$ by the lens 9 in exactly the same way. On the other hand, the magnetic lens has the same focal distance for the electron and the positron that have mutually the same energy, as will be illustrated elsewhere. Therefore, when the positrons are irradiated from the point P of the image 24 (the point on the fluorescent surface) to the lens 9, the images are formed first at the point $P_1$ of the image 25, then at the points $P_2$, $P_3$ and $P_4$ in order named and finally, at the point $P_0$ (forming the inverse image).

Next, the fact that the magnetic lens has the same focal distance for the electron and the positron having the same energy with each other, will be explained with reference to FIGS. 4 to 6.

Figure 4:
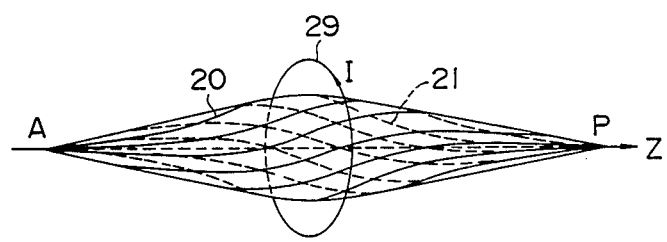
Figure 5A:
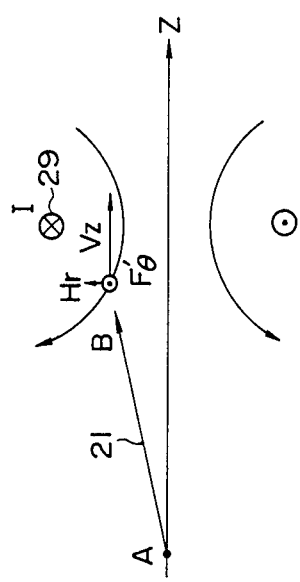
Figure 5B:
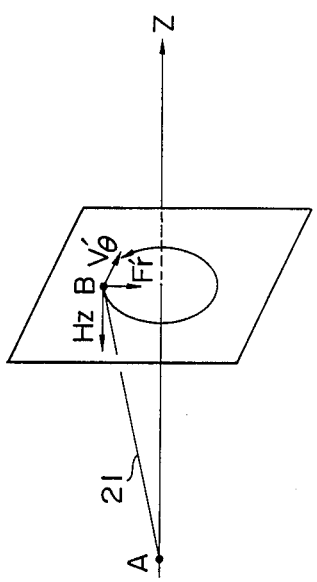

FIG. 4 shows the mode of convergence by the magnetic lens. The electron beam 20 leaving a point A passes through the magnetic lens 29 while turning spirally to the left, and forms the image at the point P. On the other hand, the positron beam 21 leaving the point A turns spirally to the right, on the contrary, but forms the image at the same point P. This can be evidenced in the following manner by use of Lorentz's force [V×B] (Fleming's lefthand law). First, let's consider the orbit of the electron with reference to FIG. 5. Assuming that the electron leaving the point A in FIG. 5(a) now arrives at the point B, the radius component Hr of the magnetic field acts upon the component Vz of the velocity in the axial direction, and force from the front to the reverse of the sheet, i.e., −e(Vz×Hr), develops. Therefore, the electron comes to possess Vz and at the same time, starts rotating (to the left relative to the travelling direction in this case) at the velocity component $V_\theta$ around the axis as shown in FIG. 5(b). When the component Hz of the magnetic field in the axial direction acts upon this velocity component $V_\theta$, converging force Fr ($=-e(V_\theta \times Hr)$) develops, and the image is formed by this force at the point P (see FIG. 4).

Figure 6A:
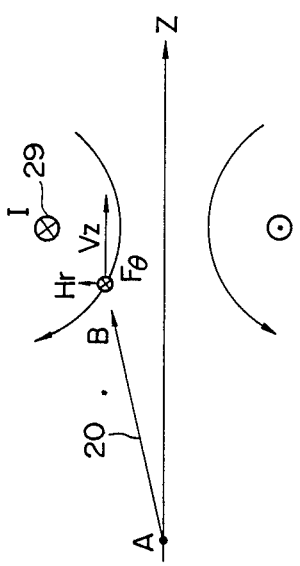
Figure 6B:
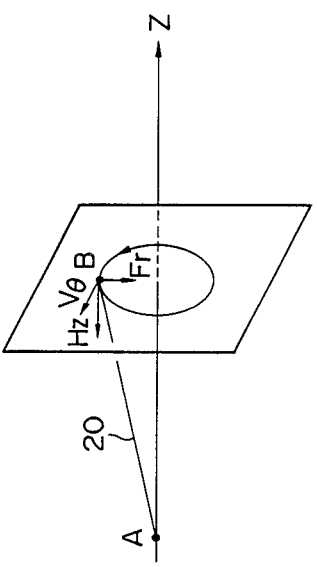

On the other hand, let's consider the case of positron at the point B shown in FIG. 6(a) in the same way. Assuming that the positron has the same energy as the electron explained with reference to FIG. 5, then the velocity component in the axial direction at the point B is Vz. The force generated by the interaction of this component Vz and the radius component Hr of the magnetic field is [+e(Vz×Hr)], and this value has the same absolute value as the electron but its direction is opposite. Therefore, the positron starts rotating (to the right relative to the travelling direction) at the velocity component $-V_\theta$ around the axis, as shown in FIG. 6(b). When the component Hz of the magnetic field in the axial direction acts upon this $-V_\theta$, the converging force expressed by the formula below develops:

$$Fr' = +e[(-V_\theta) \times Hz]$$

$$Fr' = +e[(-V_\theta) \times Hr] = -e(V_\theta \times Hz) = Fr \quad (2)$$

As can be understood from eq. (2), the converging force Fr' that acts upon the positron is exactly the same as the converging force Fr that acts upon the electron; hence, the images are formed at the same point Z, though the rotating directions are exactly opposite. It can be understood also that the magnetic lens has the same focal distance for the positron and the electron having the same energy with each other. When calculation is made in further detail, the law of lens can be established also for the magnetic lens as follows:

$$\frac{1}{a} + \frac{1}{b} = \frac{1}{f} \quad (3)$$

where:
f: focal distance,
a: distance between object and lens,
b: distance between lens and image.
The focal distance f can also be expressed by the following equation:

$$f = \frac{kE}{I^2} \quad (4)$$

where
E: energy (keV) of electron (or positron),
I: current (AT) flowing through magnetic coil,
k: constant determined by pole piece shape of magnetic lens.

Figure 7:
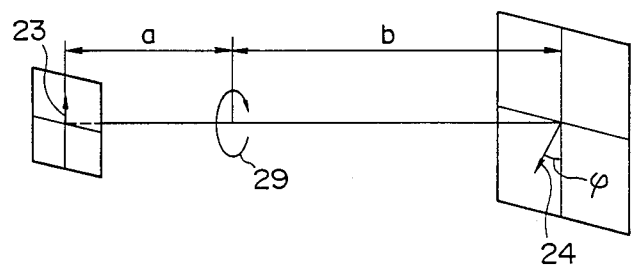

In this embodiment, since the positron is implanted through the aperture 11' at the center of the fluorescent plate (image forming surface) 11, the image formed sequentially by each lens is on the axis of the magnetic lens and causes no practical problem. However, generally when the positron is implanted from an aribitrary position of the fluorescent plate (image forming surface) 11, rotation of an image becomes a problem. In the case of ordinary optics, the image is either an inverted image or an erecting image. In the case of the magnetic lens, however, the image generally rotates as shown in FIG. 7. This is because rotation ($V_\theta$ or $-V_\theta$) for generating the converging force Fr of the magnetic lens exists as described already. Therefore, assuming that the image by the electron rotates by an angle $\phi$, the image by the positron rotates by an angle $-\phi$ as one can easily understand.

This angle of rotation $\phi$ is given by the following equation:

$$\phi = \sqrt{\frac{e}{8m\phi_0}} \int_{Z_a}^{Z_b} B(Z) dZ \quad (5)$$

where
$\phi_0$: accelerating voltage,
B(Z): magnetic flux density on the axis,
Za, Zb: Z-axis coordinates of object and image, respectively.

Figure 8:
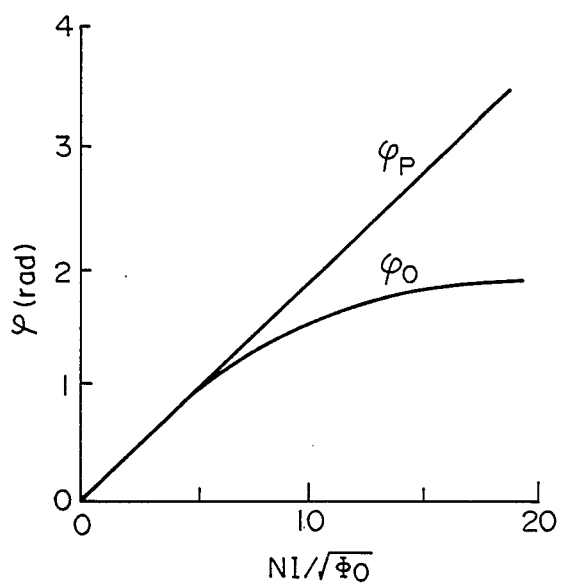

A calculation example of eq. (5) is shown in FIG. 8. In the drawing, NI represents a current (AT) which is caused to flow through the magnetic lens. $\phi_O$ is rotation by the objective lens and $\phi_P$ is rotation by the projecting lens. It can be understood readily from FIG. 8 that the total rotation angle $\phi_{total}$ can be easily adjusted to $\pi$ (rad) by adjusting the current values that are caused to flow through the objective lens and the projecting lens, respectively. When the rotation angle $\phi_{total}$ is set to $\pi$ (rad), that is, 180°, the rotation angle of the positron becomes −180° (that is, 180°), and the image by the electron can be made to coincide with the image by the positron: In this manner, the problem of the rotation of the image due to the magnetic lens can be solved.

Incidentally, this embodiment employs a system which inserts the positron source 12 at the time of irradiation of the positron beam. However, it is of course possible to employ a system which disposes a positron beam shutter in front of the positron source 12 and irradiates the positron beam by removing the shutter at the time of irradiation, or a system which disposes a deflection electrode, shifts normally the beam to another position by this deflection electrode, and passes the beam through the aperture 11' only at the time of irradiation (at the time of measurement), or the combination of such systems.

In this embodiment, the position resolution of the positron extinction analysis is approximate to the area of the aperture 11' in the observed image. In other words, the position resolution is about $\sim A/M^2$ where M is the magnification and A is the area of the aperture 11'. Therefore, the position resolution can be adjusted by adding a contraction function to the aperture 11' of the fluorescent plate (image forming surface) 11 and making the size of the aperture 11' variable. It is of course possible to make the resolution variable by changing the magnification of the electron mircoscope.

Next, other embodiments of the present invention will be described with reference to FIGS. 9 through 13. Incidentally, like reference numerals are used to identify like constituents in these drawings as in the foregoing embodiment.

Figure 9:
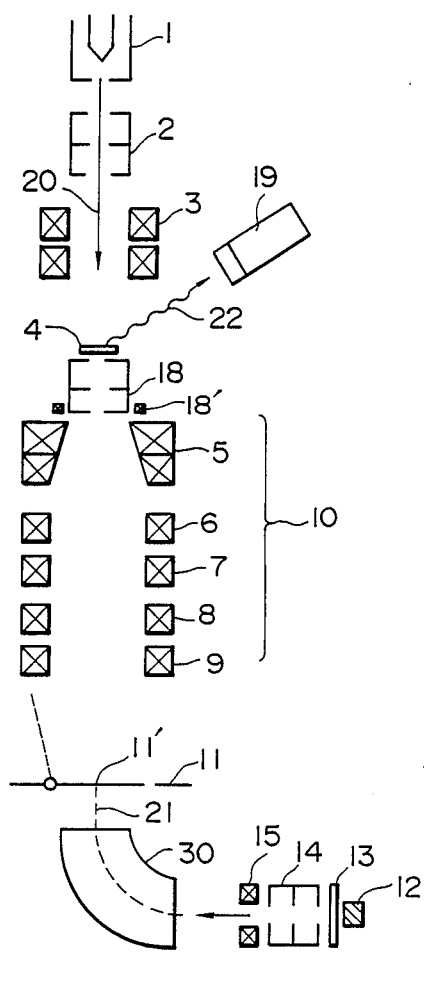
FIG. 9 is a schematic structural view of a second embodiment of the present invention.

FIG. 9 shows the second embodiment of the present invention, wherein a deflection magnet 30 is used for the positron irradiation apparatus. The positron beam emitted from the positron source 12 is subjected to thermalization, acceleration and convergence, is then deflected by an analytical magnet and is implanted into the sample 4 through the aperture 11'. Since this embodiment implants the positron through the aperture 11', it is fundamentally the same as the foregoing embodiment. However, this embodiment provides the effects that the space for the positron irradiation system can be secured easily, shield of the extinction γ-rays (stray light) resulting from the impingement of the positron against the thermalizing plate 13, the acceleration tube 14, and the like, becomes easy and the signal-to-noise ratio S/N of measurement can also be improved.

The positron irradiation apparatus of the type such as the apparatus of this second embodiment, wherein the path of the positron beam 21 from the positron source 12 to the fluorescent plate (image forming surface) 11 is deflected and the beam 21 is then passed through the axial center of the image forming lens system 10, will be hereinafter called a "deflection type axial center irradiation apparatus".

Figure 10:
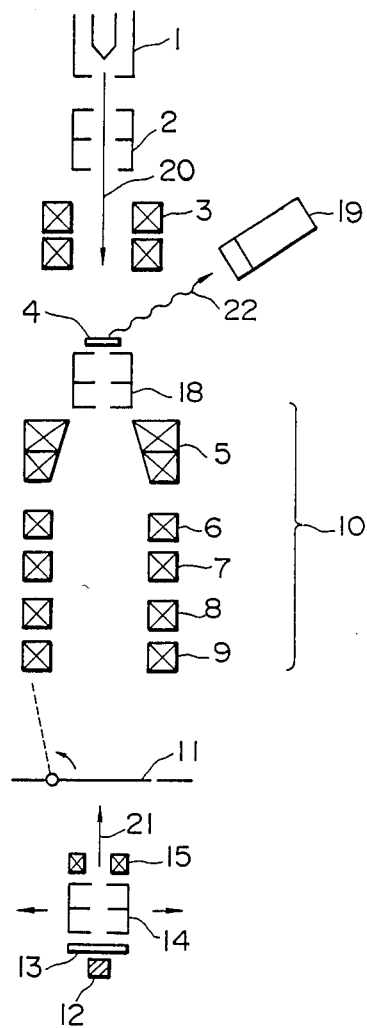
FIG. 10 is a schematic structural view of a third embodiment of the present invention.

FIG. 10 shows the third embodiment of the present invention, and represents an example of a movable positron radiation apparatus consisting of the positron source 12, the thermalizing plate 13, the positron acceleration tube 14, the convergent coil 15, and the like. In this embodiment, the aperture is not formed on the fluorescent plate (image forming surface) 11. Instead, the fluorescent plate 11 is produced by coating a fluorescent paint on both front and reverse surfaces of a transparent plate, and the fluorescent light is emitted by irradiating the positron beam to both surfaces of the fluorescent plate 11 so as to confirm the position of the positron beam on the fluorescent plate. The positron irradiation apparatus is movable and can irradiate the positron beam to an arbitrary position on the fluorescent plate 11. The flourescent plate 11 can be opened and closed as represented by dash lines in the drawing.

Next, the operation sequence of this embodiment will be explained. First of all, the positron irradiation apparatus is moved so that the fluorescent point (spot) by the positron beam comes to the position which is desired for the positron extinction analysis of the observed image. Next, the fluorescent plate 11 is sprung up in the same way as in the case of photography, and the positron beam 21 is implanted into the sample 4 through the image forming lens system 10. In accordance with this embodiment, there can be obtained the effect that an arbitrary position of the observed image can be analyzed without moving the sample position.

Incidentally, after the positron beam has passed through the predetermined position of the flourescent surface, the positron irradiation apparatus is moved by a goniometer so that it always faces the direction of the pole piece of the projecting lens 9, and in the interlocking arrangement therewith, the current of the convergent lens 15 is automatically adjusted so that the beam diameter reaches the smallest when the positron beam 21 passes through the predetermined position on the fluorescent surface 11. The positron irradiation apparatus of this system which moves the radiating position of the positron beam 21 will be hereinafter called a "ray source moving type scanning type irradiation apparatus".

It is also easy to scan the positron beam 21 by the combination of deflection electrodes without moving the positron irradiation apparatus, and such an apparatus will be called a "deflection electrode scanning type irradiation apparatus".

Figure 11:
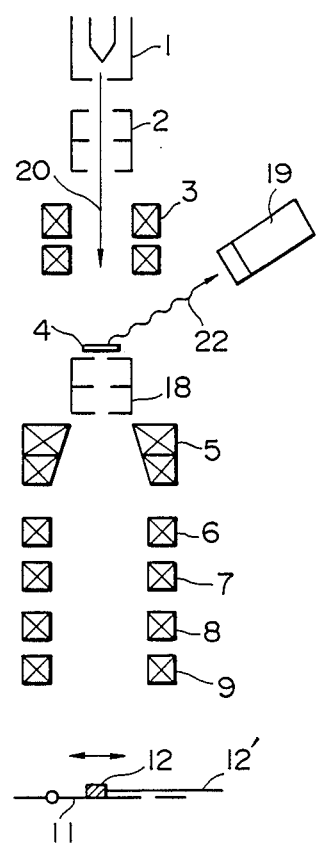
FIG. 11 is a schematic structural view of a fourth embodiment of the present invention.

FIG. 11 shows the fourth embodiment of the present invention. The positron source 12 is mounted to a support capable of moving in X-Y directions and directly scans the fluorescent plate (image forming surface) 11. The energy of the positron emitted from the positron source 12 is continuously distributed from 0 to 540 keV. When the inverse image formation is made, the orbit of the positrons whose energy is greatly different from that of the electron beam comes off remarkably and such positrons are removed halfway of the slits inserted between the lenses. Therefore, the positrons whose energy is approximate to the electron beam energy are preferentially implanted into the sample 4. This embodiment is effective as a simple system where the accuracy of the positron implantation is not much required. Incidentally, the positron deceleration tube 18 need not be disposed when the dose of the positrons may be small.

Figure 12A:
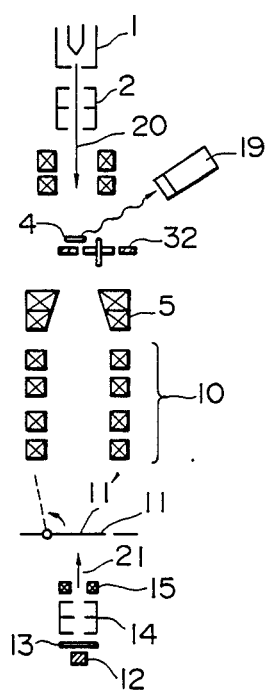
FIG. 12 is a schematic structural view of a fifth embodiment of the present invention.
Figure 12B:
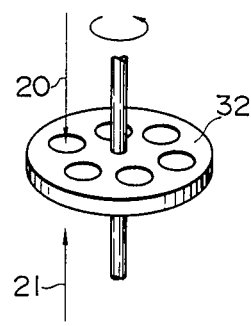

FIG. 12(A) shows the fifth embodiment of the present invention. This embodiment is effective when accuracy is not much necessary, in the same way as the embodiment shown in FIG. 11. This embodiment uses a deceleration plate 32 in place of the positron deceleration tube 18 (see FIG. 2). As shown in FIG. 12(B), the deceleration plate 32 has a large number of apertures and can rotate. Ordinary observation by the electron microscope is effected by passing the electron beam 20 through the apertures. When positron extinction analysis is conducted, the positron beam 21 is impinged against this plate 32 and is decelerated so that the positrons are checked by the sample 4. Incidentally, the deceleration function can be adjusted by changing the thickness of the deceleration plate 32 from position to position.

Although the embodiments of the present invention applied to the transmission type electron microscope have thus been described, the present invention can also be applied to electron microscopes having the image forming lens system such as irradiation type electron microscopes, projection type electron microscopes, and the like, besides the transmission type electron microscope.

Figure 13A:
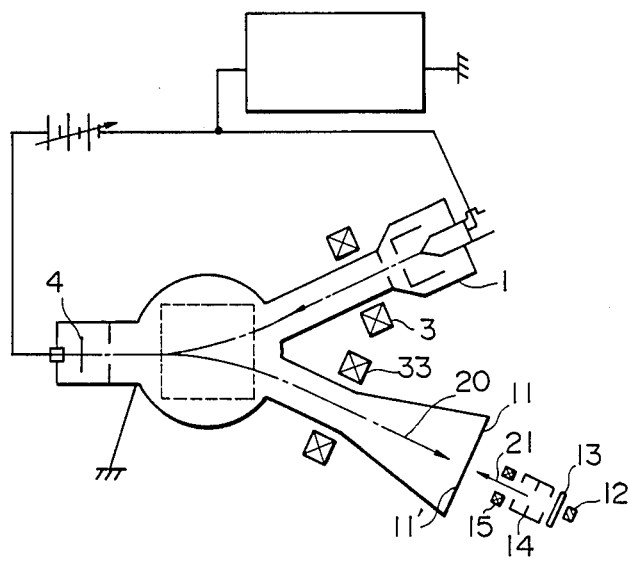
FIG. 13 is a schematic structural view of a sixth embodiment of the present invention.
Figure 13B:
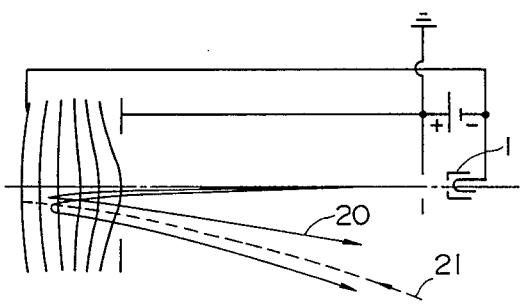

FIG. 13 shows the sixth embodiment of the present invention which is applied to an electronic mirror type electron microscope. In FIG. 13, (A) is a structural view of the embodiment and (B) shows an electronic mirror. In the electron microscope of this type, the electron beam 20 is deflected by a deflecting magnetic field and is incident to the electronic mirror, and the sample is placed at the bottom of the mirror. The incident electron beam 20 is turned away from a position very close to the sample surface, and is bent by the deflecting magnetic field and the image is formed on the fluorescent plate 11 by the projecting lens 33. When the electrons are reflected, contrast is provided due to slight corrugation on the sample surface because the electrons are very sensitive to the electric field nearby. In such an electronic mirror type electron microscope, when the positron is implanted from the side of the fluorescent plate 11 towards the projecting lens 33 (which corresponds to the image forming lens system of the foregoing embodiments), inverse image is formed on the sample 4 on the basis of the same principle as the principle of the foregoing embodiments, and the positron hits the same position as the reflecting point of the electron. Since the positron has the opposite charge to that of the electron, the positron is attracted to the sample surface at the reflection point and is implanted into the sample 4. In this manner, the positron can be implanted to the surface position of the sample 4 corresponding to the image on the fluorescent plate by the electron.

Next, the embodiments of the present invention applied to a reflection type scanning electron microscope, wherein the convergent lens system of the electron beam is used as the convergent lens system of the positron beam, will be explained.

First of all, the construction and principle of the conventional scanning electron microscope will be described briefly.

Figure 23:
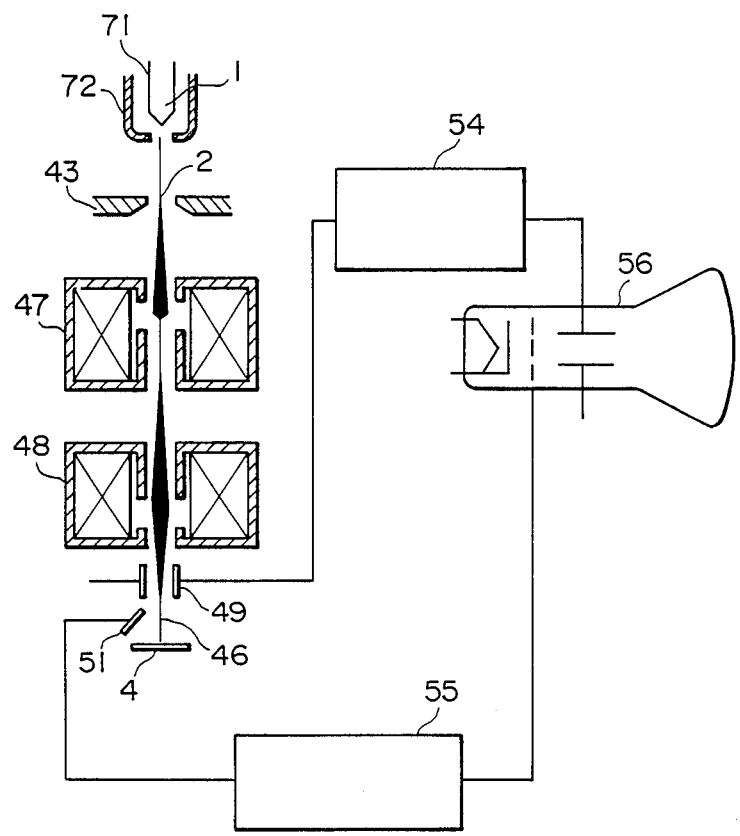
FIG. 23 is a schematic structural view of an ordinary scanning electron microscope.

FIG. 23 shows the construction of the scanning electron microscope (refer to "Lectures On Experimental Physics No. 23", "Electron Microscope", published by Kyoritsu Publication Co.). When the electron beam is irradiated to the surface of an object, secondary electrons, reflected electrons, Auger electrons, characteristic X-rays, phosphorescence, and the like, are generated. Therefore, information on the material and shape at the radiation point can be obtained by detecting signals of any of them described above by thinly contracting the electron beam and irradiating it to the sample. Furthermore, the expanded image of the sample can be obtained by scanning the thinly contracted electron beam on the sample surface and inputting the detected signal into a CRT (cathode ray tube) as a luminance modulation signal in synchronism with the scanning power source.

The above explains the principle of the scanning electron microscope. The resolution of the scanning electron microscope is determined by the diameter of the electron beam that is contracted thinly, and the thinly contracted electron beam immediately before its irradiation to the sample is particularly called an "electron probe beam". Now, the construction will be explained. In FIG. 23, the electron beam 2 emitted from the electron gun 1 is accelerated by an anode 43 and extracted towards the convergent lenses 47, 48. The electron beam 2 is converted into the electron probe beam 46 by the first and second convergent lenses 47 and 48. The resulting electron probe beam 46 is then deflected by the scanning electrode 49 and scans the sample surface. The secondary electrons and the like generated at this time are detected by a detector 51, passed through an amplifier and inputted as a grid luminance modulation signal into the CRT 66 which is in synchronism with the scanning power source, thereby providing the expanded image of the sample. Incidentally, the diameter of the electron probe beam can be contracted down to about 10 Å. Reference numerals 71 and 72 in the drawing represent a filament and a Wehnelt cylinder, respectively.

The seventh embodiment of the present invention deals with the application of the invention to the scanning electron microscope described above.

Figure 14:
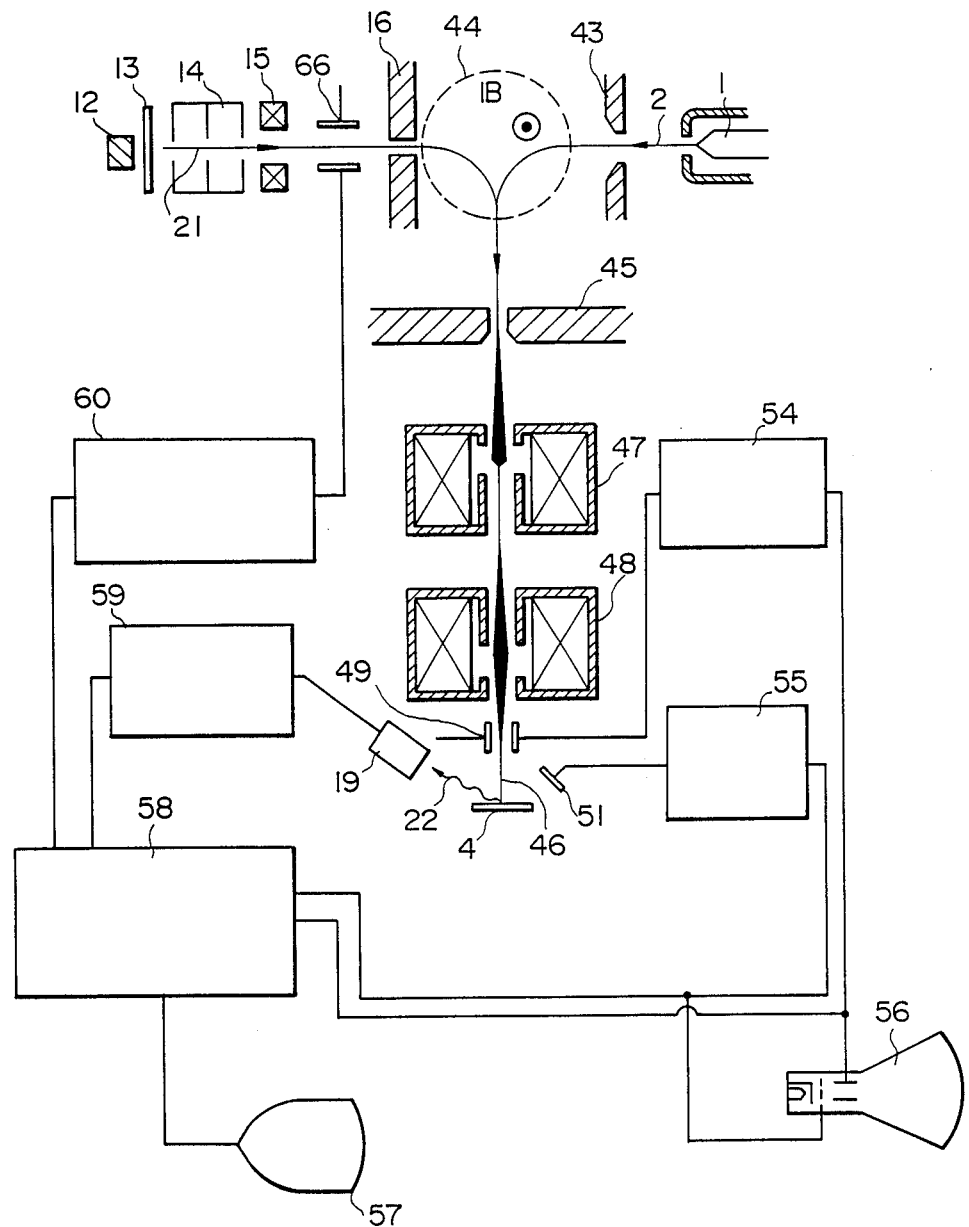
FIG. 14 is a schematic structural view of a seventh embodiment of the present invention.

FIG. 14 shows the construction of this embodiment. As shown in the drawing, the scanning electron microscope having the positron extinction analytical function in accordance with this embodiment consists of an electron irradiation system for generating and accelerating an electron beam; a positron irradiation system for generating and accelerating a positron beam; a deflecting magnet 44 for bringing the orbit of the electron beam into conformity with that of the positron beam; a convergent lens system for converging both the electron beam and the positron beam to an electron probe beam; a beam scanning system for deflecting and scanning the electron probe beam; an image display system for displaying a scanning electron microscope image; and a positron extinction analysis system for detecting, analyzing and displaying the extinction γ-rays.

In this case, the electron irradiation system consists of the electron gun 1 and the anode 43, and the positron irradiation system consists of the positron source 12, the thermalizing plate 13 fitted to the surface of the positron source 12, the positron acceleration tube 14, the convergent lens 15, the deflecting electrode 66, the positron beam deflecting power source 60 and the collimator 16. The convergent lens system consists of the first convergent lens 47, the second convergent lens 48 and the slit 45, and the beam scanning system consists of the scanning electrode 49 and the scanning power source 54. The image display system consists of the detector 51, the amplifier 55 and the image display including the CRT 56, and the positron extinction analysis system consists of the extinction γ-ray detector 19, the amplifier 59, a control/operation unit 58 consisting principally of a microcomputer and incorporating therein an A/D converter and an interface, and a data terminal 57.

Is used $^{22}$Na (positron energy range: 0~540 keV) as the positron source 12 and is used an aluminum foil as the thermalizing plate 13. Furthermore, a Ge(Li) detector is used as the extinction γ-ray detector 19.

Here, the acceleration of the electron and the positron will be explained. A predetermined voltage Vo in the range of from 0 to 30 kV is applied to the anode 43 of the scanning electron microscope, and a voltage Vo is applied to the positron acceleration tube 14 so that the positron beam has the same energy as the electron beam. In this embodiment, acceleration of the electron beam is made only by the anode 43 without using the acceleration tube.

Next, some important terms in the present invention will be defined as follows before the description of the operation method and function of this apparatus.

The term "positron irradiation system" means systems in general which irradiate the positrons emitted from the positron source to the sample, and the term "electron irradiation system" means systems in general which irradiate the electrons to the sample. The term "positron-electron mixing irradiation system" means systems which guide both the electron beam and the positron beam to the axial center of the convergent lenses and implant them into the sample in the axial direction through the convergent lens system. However, the term "mixing irradiation" does not necessarily mean that the electron beam and the positron beam are implanted simultaneously time-wise, but embraces also the implantation of two kinds of beams which are independent time-wise.

Furthermore, the term "convergent lens system" means systems in general which converges the electron beam to the electron probe beam. Therefore, the objective lenses of ordinary scanning electron microscopes are embraced in this system in addition to the convergent lenses. The term "positron extinction analysis system" means systems in general which detect, count, processes the data of, analyzes and displays the result of, the extinction γ-rays generated when the positron undergoes extinction in the sample.

Now, the operation method and function of this apparatus will be described. The voltage Vo is applied to both the anode 43 and the positron acceleration tube 14. Under this state, the electron beam 2 emitted from the electron gun 1 is deflected by the deflecting magnet 44 and is guided to the slit 45. The electron beam 2 thus guided to the slit 45 is converged to the electron probe beam by the convergent lens system on the basis of the principle of the scanning electron microscope and scans the surface of the sample 4, thereby providing the scanning electron microscopic image. Here, if a region of which analysis is desired to be made by use of the positron extinction analytical method among the image that is being observed exists, it is designated from the data terminal 57 to the control-operation unit 58. The positron source 12 is mounted to the positron irradiation system, and the positrons (energy range: 0~540 keV) emitted from the positron source 12 are allowed to be incident to the thermalizing plate 13 and converted to thermal energy. After the energy distribution width is set in the 1 eV order, it is accelerated by the positron acceleration tube 14, so that the monochroic positron beam 21 having the same energy value Vo (keV) as the energy of the electrode beam 2 can be obtained.

The positron beam 21 thus accelerated is then converged by the convergent coil 15 and is then implanted into the deflecting magnet 44 through the collimator 16. However, this implantation is not always effected, but normally the positron beam 21 is deflected by the deflecting electrode 66 and does not pass through the collimator 16. When implantation is necessary, the voltage of the deflecting electrode 66 is cut off (or adjusted) at such a timing that the positron beam can be implanted to the region for which the positron extinction analysis is to be made and which is in advance inputted into the control-operation unit 58. Then, the positron beam 21 is implanted to the deflecting magnet 44 through the collimator 16. In order to obtain this timing, the scanning power source 54 and the positron beam deflecting power source 60 are synchronized with each other through the control-operation unit 58.

Now, the magnetic field B directs from the reverse to the front of the sheet of drawing in the deflecting magnet 44 and the positron beam 21 is deflected to the right with respect to the travelling direction as shown in the drawing, so that it passes through the slit 45 under the state where it is superposed with the orbit of the electron beam 2. After passing through the slit 45, the positron beam 21 is converged to the electron probe beam by the convergent lenses in exactly the same way as the electron beam on the basis of the later-appearing principle, and is implanted into the sample 4 into which the electron beam 2 is to be implanted, under the deflection control state. However, the deflecting direction of the positron beam is opposite to that of the electron beam and hence, cautions described below must be taken when obtaining the implantation timing for the positron beam.

The extinction γ-rays 22 resulting from the positron that has thus been implanted into the sample 4 is detected by the extinction γ-ray detector 19, and its detection signal is inputted into the control-operation unit 58 through the amplifier 59. The control-operation unit 58 executes predetermined positron extinction analysis and displays the result of analysis on the data terminal 57 depending upon the model of the unit 58.

Figure 15:
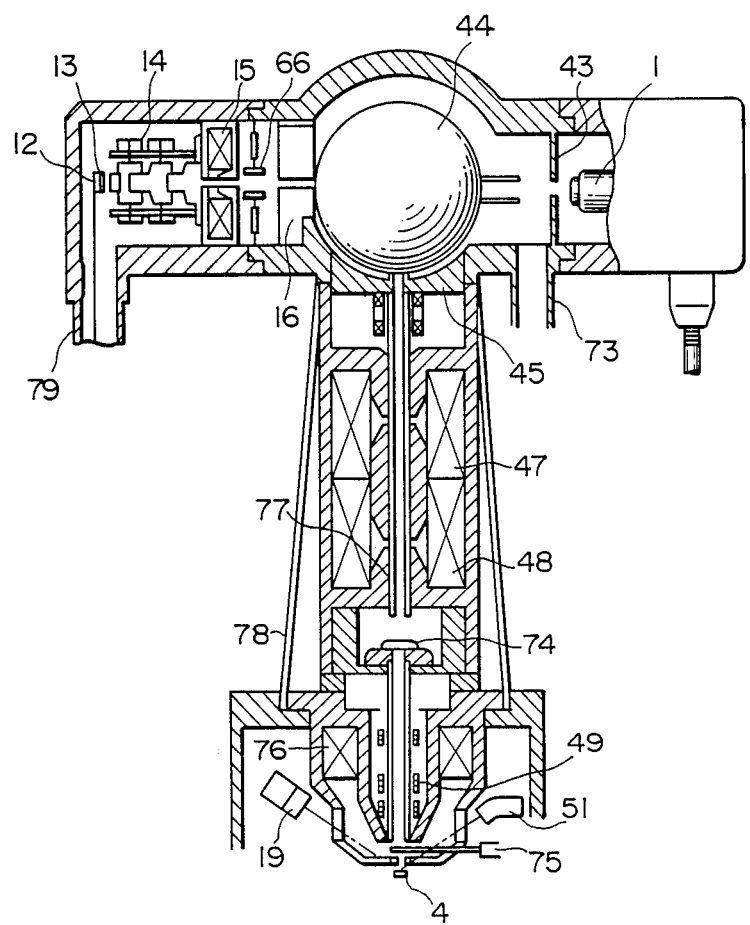
FIG. 15 is a longitudianl sectional view of a scanning microscope portion of the apparatus shown in FIG. 14.

Though the main construction, function and operation method of the seventh embodiment have thus been described, FIG. 15 shows the longitudinal section of the scanning electron microscope portion of this embodiment. The interior of a lens-barrel is evacuated through an exhaust port 73, and an air lock valve 74 is closed to keep vacuum inside the lens-barrel when the sample 4 is fitted. A magnetic shield 78 is disposed around the lens-barrel in order to cut off any detrimental magnetic field from outside. Permalloy, for example, is used as the material of the magnetic shield 78. Reference numerals 76, 77 and 79 represent an auxiliary coil, a liner tube and a position source insertion port, respectively.

The reason why the positron beam having exactly the same energy as the electron beam is converged by the convergent lens (magnetic lens) in exactly the same way as the electron beam or why it is image-formed at the same point can be explained by the aforementioned fact that the magnetic lens has the same focal distance for the positron and the electron that have mutually the same energy in the same way as in the aforementioned transmission electron microscope.

Figure 16:
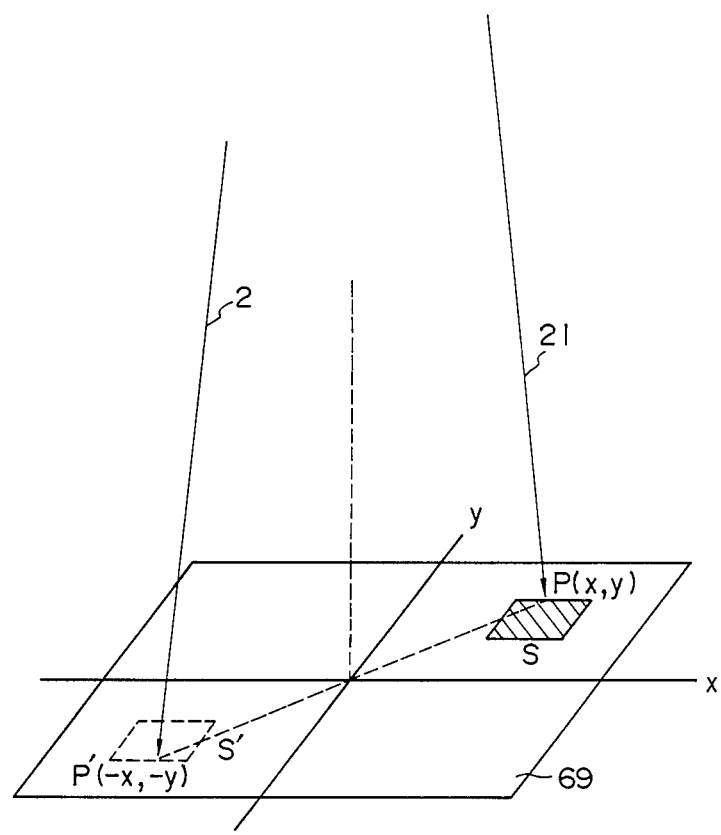
FIG. 16 is a view useful for explaining the implantation timing of a positron beam.

Next, the implantation timing of the positron beam will be explained with reference to FIG. 16. Let's consider the case where the positron beam 21 is implanted into the scanning surface 69 of the electron probe beam, that is, into the region S on the observation surface. Then, the positron beam 21 is converged by the convergent lens system to the electron probe beam in exactly the same way as the electron beam 2, but is deflected in the exactly opposite direction at the scanning electrode 49. In FIG. 16, when the positron beam 21 is irradiated to the point P (x, y), the electron beam 2 is irradiated to a point P' (−x, −y) which is symmetric with the point P with respect to the origin (center of scanning surface). Therefore, when it is desired to implant the positron into a certain region S on the observation surface, it can be understood that the positron beam 21 may be implanted into the convergent lens system by regulating the voltage of the deflecting electrode 66 when the electron beam 2 scans the region S', which is symmetric with the region S with respect to the origin. In practice, when the region S into which the positron beam 21 is desired to be implanted is inputted to the control-operation unit 58 through the data terminal 57, the control-operation unit 58 converts the region S to the region S' and synchronizes the scanning power source 54 with the positron beam deflecting power source 60.

Still another embodiment of the apparatus using the convergent lens system of the electron microscope will be described next.

Figure 17:
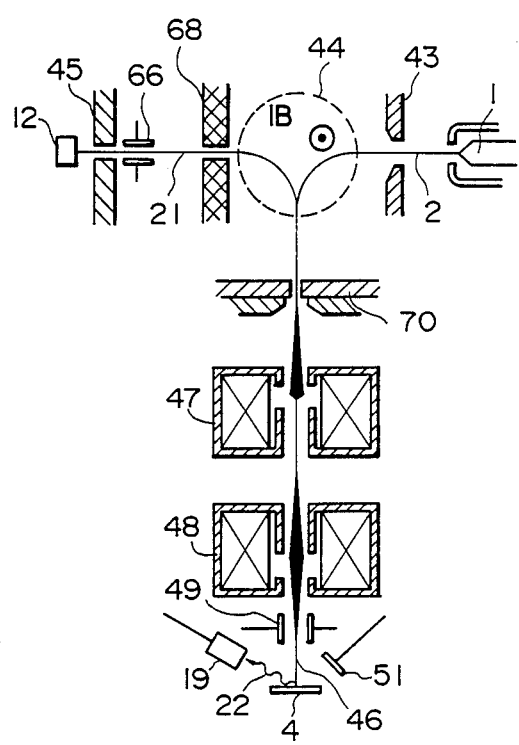
FIG. 17 is a schematic structural view of an eighth embodiment of the present invention.

FIG. 17 shows an embodiment wherein the positron emitted from the positron source 12 is as such implanted towards the deflecting magnet 44 without using the thermalizing plate and the acceleration tube for the positron irradiation system, the deflecting magnet 44 is used also as an energy analyzer of the positron beam 21 and only the positron having the same energy as that of the electron beam 2 is implanted into the convergent lens system. In this case, the energy width of the positron beam 21 implanted into the convergent lens system depends upon the diameter of the cut-off slit 70. The cut-off slit 70 has several holes having different diameters and a desired diameter is selected in accordance with the intended object. The value of the voltage applied to the deflecting electrode 66 is at least a value which can deflect the positron emitted from the positron source and having the maximum energy (540 keV in the case of the $^{22}$Na source) does not pass through the holes of the collimator 68. The positron-electron mixing irradiation system which uses the deflecting magnet as the energy analyzer for the positron is called a "positron energy analysis type mixing irradiation system".

Figure 18:
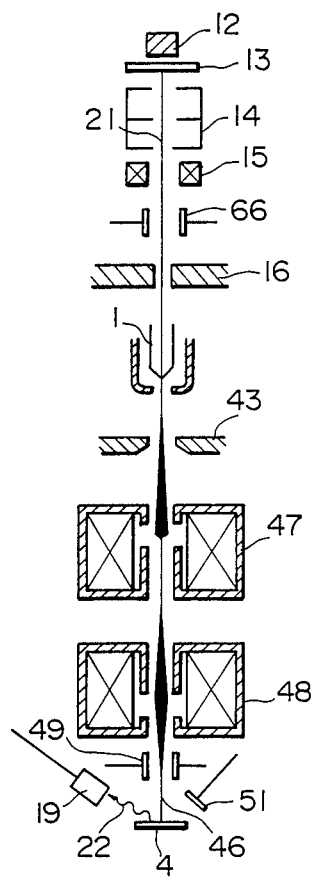
FIG. 18 is a schematic structural view of a ninth embodiment of the present invention.
Figure 19:
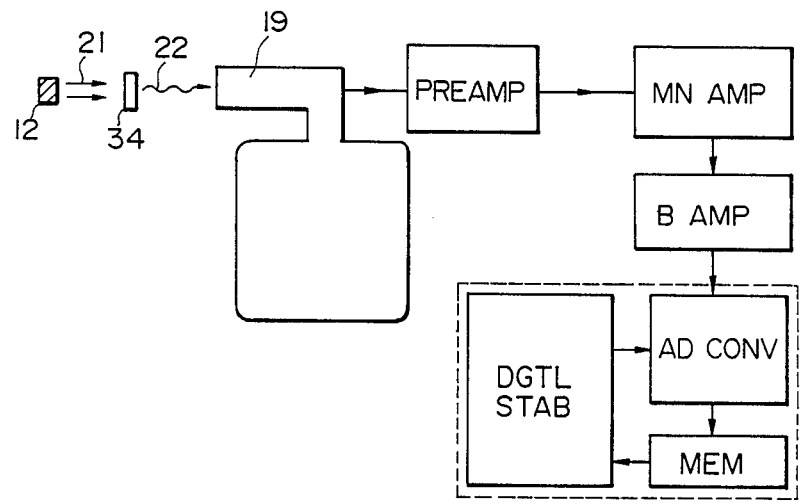
FIG. 19 is a system diagram of a conventional positron extinction analytical apparatus.
Figure 20:
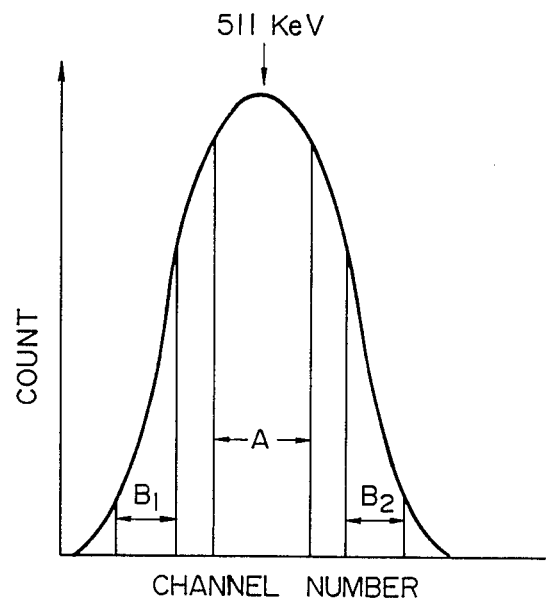
FIG. 20 is a view useful for explaining the principle of a positron extinction analytical method.

FIG. 18 shows still another embodiment wherein the positron irradiation system and the electron irradiation system are disposed in series. This construction does not need the deflecting magnet and hence, becomes simplified. The filament used for the electron gun 1 is of a hollow type, and has a construction so that the positron beam can penetrate through its axial center. Incidentally, when the positron beam passes through the anode 43, it is decelerated in this case. For, a voltage Vo (V) is applied to the anode 43 in order to accelerate the electron so that the positron is decelerated by Vo (keV), on the contrary. Therefore, a voltage 2 Vo (V) is applied to the positron acceleration tube 14 so that the positron beam 21 and the electron beam 2 have the same energy in the convergent lens system. The positron-electron mixing type irradiation sytem in which the electron irradiation system and the positron radiation system are disposed in series as in this embodiment is called a "series type mixing irradiation system".

Though the present invention has thus been described with reference to some preferred embodiments thereof which use the electron beam to obtain the scanning electron microscopic image, but the positron beam can be used effectively in place of the electron beam. This is because when the positron beam is irradiated to the surface of an object, secondary electrons and the characteristic X-rays are generated in the same way as in the case of the electron beam described already, and the scanning electron microscope image can be obtained by detecting the secondary electrons. If the positron extinction analysis is made by use of such an apparatus, the scanning electron microscopic image is first obtained. At this time, the extinction $\gamma$-rays are generated from the entire surface of the scanning electron microscopic image. Next, a desired region for which positron extinction analysis is to be made is determined, and is then subjected to the positron extinction analysis by contracting the image to the desired region (or contracting the scanning surface). Therefore, if the positron beam alone is used, the electron irradiation system such as the electron gun need not be disposed and hence, the construction becomes simplified as much.

Incidentally, in the apparatus having the aforementioned electron irradiation system, the characteristic X-rays and the like are superposedly detected together with those resulting from the electron beam from the region into which the positron beam is implanted, when the positron extinction analysis is being made. Therefore, it is possible to increase the image luminance of the positron beam implanatation region in the scanning electron microscopic image and to confirm the position of positron extinction analysis. It is also effective to obtain only the image of the position of the positron extinction analysis resulting from the positron by stopping temporarily the irradiation of the electron beam. It is further effective to conduct the positron extinction analysis in the direction of depth of the sample by changing the energy of the positron beam.

Although the present invention illustrates by way of example the apparatus which measures the extinction $\gamma$-ray energy spectrum as the extinction $\gamma$-ray detector, it is also possible:

(1) to measure the $\gamma-\gamma$ angular correlation by disposing a pair of $\gamma$-ray detectors (at least one of which is finely movable (about $\pm 5.0$ m rad) on the circumference with the sample being the center) on both sides of the sample; and (2) to measure the life of the positron by interruptedly implanting the positron beam in the order of several PS.

What is claimed is:

1. A positron extinction analytical method comprising the steps of:
    irradiating a positron beam to a sample to be analyzed through a convergent lens system consisting of a magnetic lens; and
    measuring extinction $\gamma$-rays generated from the sample irradiated by the positron beam to analyze the sample.

2. The positron extinction analytical method as defined in claim 1, wherein the irradiation of the sample by the positron beam implants positrons into the sample, and further comprising the step of decelerating the energy of the positrons to a level of about thermal energy after the positron beam has passed through the convergent lens system and before it is implanted into the sample.

3. The positron extinction analytical method as defined in claim 1, further comprising the steps of emitting positrons from a positron source so as to be incident on a thermalizing plate, converting the positrons incident on the thermalizing plate to a thermal energy having a thermal energy distribution width on the order of leV, thereafter accelerating the positrons to a monochroic positron beam and irradiating the sample through the conversion lens system with the positron beam.

4. A positron extinction analytical apparatus comprising:
    a positron irradiation apparatus having a positron source for emitting positrons;
    a convergent lens system for converging and irradiating the positrons from said positron irradiation apparatus as a positron beam to a sample to be analyzed, said convergent lens system consisting of a magnetic lens; and
    a measuring apparatus for measuring the extinction $\gamma$-rays generated from said positron-irradiated sample.

5. The positron extinction analytical apparatus as defined in claim 4 wherein the positrons are irradiated to said sample by use of an image forming lens system of an electron microscope for an electron beam as said convergent lens system for the positron beam.

6. The positron extinction analytical apparatus as defined in claim 5, wherein the energy of the positron beam passing through said image forming lens system is made to be equal to the energy of the electron beam.

7. The positron extinction analytical apparatus as defined in claim 6, wherein a positron deceleration tube is disposed between said image forming lens system and a sample setting portion.

8. The positron extinction analytical apparatus as defined in claim 6, wherein said positron radiation apparatus consists of a positron source for emitting positrons, a thermalizing plate for converting the positrons emitted from said positron source to heat energy, a positron acceleration tube for accelerating the positron thus converted to heat energy, and a convergent lens system for converging the accelerated positron beam.

9. The positron extinction analytical apparatus as defined in claim 8, wherein said positron radiation apparatus includes a collimator between said convergent lens and said image forming lens system.

10. The positron extinction analytical apparatus as defined in claim 5, wherein said extinction γ-ray measuring apparatus consists of an extinction γ-ray detector disposed slantingly at the rear of said sample as viewed from the irradiating direction of the positrons.

11. The positron extinction analytical apparatus as defined in claim 5, wherein an aperture for passing the positron beam therethrough is formed at the center of a fluorecent plate constituting an image forming surface of the electron beam.

12. The positron extinction analytical apparatus as defined in claim 11 wherein said fluorescent plate constituting the image forming surface of the electron beam has an openable and closable structure, and is opened when the positron beam is radiated to said sample.

13. The positron extinction analytical apparatus as defined in claim 7, wherein a correction coil for correcting the orbit of the positron beam is disposed between said image forming lens system and said positron deceleration tube.

14. The positron extinction analytical apparatus as defined in claim 5, wherein said positron irradiation apparatus is a linear type axial center radiation apparatus whose axial center is in agreement with that of said image forming lens system.

15. The positron extinction analytical apparatus as defined in claim 8, wherein said positron source is of a type which is inserted into said positron irradiation apparatus at the time of radiation of the positron beam.

16. The positron extinction analytical apparatus as defined in claim 8, wherein a positron beam shutter is disposed in front of said positron source in said positron irradiation apparatus and is opened at the time of irradiation of the positron beam.

17. The positron extinction analytical apparatus as defined in claim 8, wherein a deflecting magnet is disposed in front of said convergent lens in order to deflect the path of the positron beam from said positron source to the image forming surface of the electron beam.

18. The positron extinction analytical apparatus as defined in claim 5, wherein said positron irradiation apparatus is a deflection type axial center irradiation apparatus which deflects the path of the positron beam from said positron source to an image forming surface of the electron beam and then passes the positron beam through the axial center of said image forming lens system.

19. The positron extinction analytical apparatus as defined in claim 12, wherein said positron irradiation apparatus is a linear source moving type scanning type irradiation apparatus which can move in parallel with the image forming surface of the electron beam.

20. The positron extinction analytical apparatus as defined in claim 19, wherein said fluorescent plate constituting the image forming surface consists of a transparent plate which is coated by a fluorescent paint on both front and reverse surfaces thereof.

21. The positron extinction analytical apparatus as defined in claim 12, wherein said positron irradiation apparatus is a deflecting electrode type scanning type irradiation apparatus which scans the positron beam by the combination of deflecting electrodes.

22. The positron extinction analytical apparatus as defined in claim 5, wherein said positron irradiation apparatus has a structure in which said positron source moves in X-Y directions on an image forming surface of the electron beam.

23. The positron extinction analytical apparatus as defined in claim 6, wherein a deceleration plate is disposed between a image forming lens system and said sample setting portion.

24. The positron extinction analytical apparatus as defined in claim 23, wherein said deceleration plate has a large number of holes and is capable of rotating.

25. The positron extinction analytical apparatus as defined in claim 4, wherein the positrons are irradiated to said sample by use of a convergent lens system of an electron microscope for an electron beam as said convergent lens system for the pistron beam.

26. The positron extinction analytical apparatus as defined in claim 25, wherein the energy of the electron beam is made to be equal to that of the positron beam.

27. The positron extinction analytical apparatus as defined in claim 25, wherein said electron microscope is a scanning electron microscope, and the positron beam is made to be incident to said convergent lens system of the electron beam by said deflecting magnet.

28. The positron extinction analytical apparatus as defined in claim 25, wherein said electron microscope is a scanning electron microscope, and the positron beam is made to be incident to the axial center of a hollow-type electron gun form behind said electron gun.

29. The positron extinction analytical apparatus as defined in claim 27, wherein the energy of the positron beam is analyzed by said deflecting magnet, and the positron beam having the same energy as that of the electron beam is irradiated to said sample by a cut-off slit.

30. An electron microscope for observing a sample to be analyzed by irradiating an electron beam to said sample, said electron microscope including means for irradiating a positron beam from a positron source emitting positrons by use of a magnetic lens of said electron microscope as a convergent lens sytem to said sample to be analyzed, means for measuring extinction γ-rays generated from said sample when said sample is irradiated by the positron beam and for performing analysis of said sample.

31. The electron microscope as defined in claim 30, wherein said magnetic lens is an image forming lens system of the electron beam, and the positron beam is made to be incident to said image forming lens system from a side opposite to the electron beam.

32. The electron microscope as defined in claim 30, wherein said magnetic lens is a convergent lens system of the electron beam, and the positron beam and the electron beam travel in the same direction through said image forming lens system.

33. The electron microscope as defined in claim 27, wherein the path of the electron beam is made to be in agreement with that of the positron beam by said deflecting magnet.

* * * * *